(12) United States Patent
Yamada et al.

(10) Patent No.: US 10,797,494 B2
(45) Date of Patent: Oct. 6, 2020

(54) POWER SUPPLY ADAPTER AND METHOD FOR SUPPLYING ELECTRIC POWER TO ELECTRIC WORKING MACHINE

(71) Applicant: MAKITA CORPORATION, Anjo-shi, Aichi (JP)

(72) Inventors: Toru Yamada, Anjo (JP); Takayoshi Endo, Anjo (JP); Hiroki Oka, Anjo (JP)

(73) Assignee: MAKITA CORPORATION, Anjo-Shi (JP)

( * ) Notice: Subject to any disclaimer, the term of this patent is extended or adjusted under 35 U.S.C. 154(b) by 218 days.

(21) Appl. No.: 15/880,441

(22) Filed: Jan. 25, 2018

(65) Prior Publication Data

US 2018/0233936 A1  Aug. 16, 2018

(30) Foreign Application Priority Data

Feb. 10, 2017 (JP) ................. 2017-023267

(51) Int. Cl.
*H02J 7/00* (2006.01)
*B25F 5/00* (2006.01)
(Continued)

(52) U.S. Cl.
CPC ............. *H02J 7/0042* (2013.01); *B25F 5/00* (2013.01); *G01K 1/14* (2013.01); *G01K 3/005* (2013.01);
(Continued)

(58) Field of Classification Search
CPC ........ H02J 7/0042; H02J 7/027; H02J 7/0031; H02J 7/0052; H02J 7/0045; G01R 31/36;
(Continued)

(56) References Cited

U.S. PATENT DOCUMENTS 9,564,719 B1 * 2/2017 Oldham ............ H01R 13/7137
2011/0284257 A1   11/2011 Ogino et al.
(Continued)

FOREIGN PATENT DOCUMENTS

JP   2011244387 A   12/2011
JP   2014117142 A    6/2014
(Continued)

OTHER PUBLICATIONS

Jul. 28, 2020 Office Action issued in Japanese Patent Application No. 2017-023267.

*Primary Examiner* — Rexford N Barnie
*Assistant Examiner* — Elim Ortiz
(74) *Attorney, Agent, or Firm* — Oliff PLC

(57) ABSTRACT

A power supply adapter according to one aspect of the present disclosure includes a power cord, a power-source attachment portion, a working-machine attachment portion, a temperature detector, and an overheat determiner. The temperature detector is configured to detect temperature of the power cord and to output a detection signal indicating the temperature detected. The overheat determiner is configured to determine that the power cord is in an overheated state based on the detection signal from the temperature detector and to output an overheat determination result indicating that the power cord is in the overheated state.

13 Claims, 6 Drawing Sheets

(51) Int. Cl.
    *G01K 3/00*          (2006.01)
    *G01R 31/34*        (2020.01)
    *H02J 7/02*          (2016.01)
    *G01K 1/14*          (2006.01)
    *G01R 31/36*        (2020.01)
    G05D 23/19        (2006.01)
    H01M 2/34         (2006.01)
    H01R 31/06        (2006.01)

(52) U.S. Cl.
    CPC ........... *G01R 31/343* (2013.01); *G01R 31/36* (2013.01); *H02J 7/00* (2013.01); *H02J 7/0029* (2013.01); *H02J 7/0031* (2013.01); *H02J 7/0045* (2013.01); *H02J 7/0068* (2013.01); *H02J 7/027* (2013.01); *G05D 23/19* (2013.01); *H01M 2/34* (2013.01); *H01R 31/065* (2013.01)

(58) Field of Classification Search
    CPC .. G01K 1/14; H01R 13/7137; H01R 13/6683; B60L 53/16
    See application file for complete search history.

(56) References Cited

U.S. PATENT DOCUMENTS

| | | |
|---|---|---|
| 2012/0133218 A1 | 5/2012 | Fujii |
| 2014/0160611 A1 | 6/2014 | Lam et al. |
| 2015/0022141 A1 | 1/2015 | Oku |

FOREIGN PATENT DOCUMENTS

| | | |
|---|---|---|
| JP | 2015023712 A | 2/2015 |
| JP | 2016026895 A | 2/2016 |
| WO | 2010/092885 A1 | 8/2010 |

\* cited by examiner

POWER SUPPLY ADAPTER AND METHOD FOR SUPPLYING ELECTRIC POWER TO ELECTRIC WORKING MACHINE

CROSS-REFERENCE TO RELATED APPLICATIONS

This application claims the benefit of Japanese Patent Application No. 2017-023267 filed on Feb. 10, 2017 with the Japan Patent Office, the disclosure of which is incorporated herein by reference.

BACKGROUND

The present disclosure relates to a power supply adapter that supplies electric power from a power supply device to an electric working machine through a power cord.

This type of power supply adapter includes a power cord and attachment portions provided at both ends of the power cord and configured to be attachable to and detachable from the power supply device and the electric working machine. The attachment portions each includes terminals to be coupled to power supply terminals of the power supply device and of the electric working machine when the attachments are respectively attached to the power supply device and the electric working machine.

An example of the power supplying device for an electric power tool is a battery pack configured to monitor the state of a battery installed therein and to output a status signal indicating whether the battery can supply electric power to the electric working machine from a terminal for signal output.

A power supply adapter used for supply electric power from this type of a battery pack to an electric working machine is disclosed, for example, in International Patent Application Publication No. WO2010/092885. The aforementioned power supply adapter includes a terminal configured to input/output status signals in/from attachment portions provided at both ends of a power cord. The aforementioned power cord includes, in addition to positive and negative power supply lines, a signal line through which the status signals are transmitted.

SUMMARY

With the aforementioned power supply adapter, an electric working machine, such as an electric power tool, can be used without directly attaching a power supply device, such as a battery pack, to the electric working machine. Thus, the weight of the electric working machine during use can be reduced, which can make the electric working machine easier to handle.

When the aforementioned power supply adapter is attached to the electric working machine, not only the weight of the attachment portion of the power supply adapter for the electric working machine, but also the weight of the power cord drawn out from the attachment is added to that of the electric working machine.

To further reduce the weight of the electric working machine during its use, the weight of the power cord needs to be reduced. This can be achieved by reducing the diameter of the power cord.

However, reducing the diameter of the power cord makes the power cord more easily generate heat because of the electric current flowing therein. The heat of the power cord may give unpleasant feelings to a user.

It is desirable that one aspect of the present disclosure provides a power supply adapter that is easier to handle while reducing unpleasant feelings given to a user due to temperature increase of the power cord.

A power supply adapter according to one aspect of the present disclosure includes a power cord, a power-source attachment portion, and a working-machine attachment portion.

The power cord includes a first end and a second end and is configured to supply electric power from a power supply device to an electric working machine. The power-source attachment portion is configured to be attachable to the power supply device and to couple the first end of the power cord to the power supply device. The working-machine attachment portion is configured to be attachable to the electric working machine and to couple the second end of the power cord to the electric working machine. Thus, when the power-source attachment portion and the working-machine attachment portion are respectively attached to the power supply device and the electric working machine, current power can be supplied through the power cord from the power supply device to the electric working machine.

Since large drive current flows in the power cord when the electric working machine is driven, the power cord tends to generate heat due to the drive current. In particular, in a case where the diameter of the power cord is small and the inner resistance of the power cord is large, the amount of heat generation of the power cord becomes large and the power cord becomes overheated.

The power supply adapter according to one aspect of the present disclosure thus further includes a temperature detector and an overheat determiner. The temperature detector is configured to detect temperature of the power cord and to output a detection signal indicating the temperature detected. The overheat determiner is configured to determine that the power cord is in an overheated state based on a detection signal from the temperature detector and to output an overheat determination result indicating that the power cord is in the overheated state.

To improve the maneuverability of the electric working machine for a user to hold the electric working machine with hands and use the same, the power supply adapter according to one aspect of the present disclosure is configured with thin power supply lines included in the power cord so that the weight of the power cord is reduced. This structure makes the power cord more easily become overheated. Nevertheless, in the power supply adapter according to one aspect of the present disclosure, determination of the overheated state of the power cord can be made and the overheat determination result can be outputted.

The output of the overheat determination result by the power supply adapter can limit or stop the power supply from the power supply device to the electric working machine. This structure reduces unpleasant feelings given to a user due to temperature increase of the power cord, which in turn makes the power supply adapter easier to handle.

The power supply adapter may further include a notifying device configured to notify the electric working machine of the overheat determination result. Such structure can limit or stop driving of the electric working machine. Consequently, the power supply adapter can reduce current flowing in the power cord and inhibit further temperature increase in the power cord.

The power supply adapter may further include an interrupting device configured to interrupt a power supply path from the power supply device to the electric working machine in response to an output of the overheat determination result from the overheat determiner. Thus, the power supply path can be interrupted only by the power supply adapter when the power cord becomes overheated. Without relying on the operation of the electric working machine, the power supply adapter alone can inhibit temperature increase of the power cord.

The overheat determiner may be configured to keep outputting the overheat determination result during a period from determination of the overheated state of the power cord until detachment of the power-source attachment portion from the power supply device. This structure can inhibit power supply from the power supply device to the electric working machine from being resumed against the user's intention, in a case where the temperature of the power cord decreases after the overheated state of the power cord is determined.

The overheat determiner may be configured to be operated upon receipt of electric power supplied from the power supply device. In this case, the power supply adapter may further include a capacitor disposed in a power supply path from the power supply device to the overheat determiner. The capacitor may be configured to be charged by the electric power supplied from the power supply device and to be able to supply charging power to the overheat determiner.

This structure can inhibit malfunction of the overheat determiner in a case, for example, wherein power supply voltage temporarily decreases in response to the initiation of operation of the electric working machine. This structure reduces the probability that the power supply from the power supply device to the electric working machine is inhibited due to malfunction of the overheat determiner.

The temperature detector may be disposed in the working-machine attachment portion and positioned in a power supply path so as to be away from a terminal coupled to the electric working machine.

Being a detector that detects the temperature of the power cord, the temperature detector may be disposed along the power cord. In a case where the temperature detector cannot be easily disposed along the power cord, the temperature detector may be installed in the working-machine attachment portion or in the power-source attachment portion.

In a case where the temperature detector is disposed in the working-machine attachment portion and positioned in the terminal coupled to the electric working machine, the heat transferred from the power cord to the terminal is further transferred to the electric working machine. In this case, heat tends to be released from the terminal, which makes detection or estimation of the temperature of the power cord difficult.

Thus, in a case wherein the temperature detector is disposed in the working-machine attachment portion and positioned in power supply path so as to be away from the terminal, the temperature of the power cord can be more accurately detected or estimated. This structure allows the overheat determiner to make the overheat determination with good accuracy.

In this case, the working-machine attachment portion may include a connection cord coupled to the power cord so as to form a portion of the power supply path. The temperature detector may be disposed along the connection cord.

This structure allows the temperature detector to more accurately detect or estimate the temperature of the power cord through the connection cord to which the power cord is directly coupled, which in turn improves the accuracy in the overheat determination made by the overheat determiner.

The notifying device may be disposed in a communication path to be coupled to the electric working machine and configured to interrupt the communication path in response to an output of the overheat determination result from the overheat determiner so as to notify the electric working machine of the overheat determination result.

This structure enables the electric working machine to recognize the overheated state of the power cord through detecting the interruption of the communication path.

The temperature detector may be covered together with the connection cord by a shrunk tube and secured to the connection cord by the shrunk tube.

In this way, the temperature detector can be firmly secured to the connection cord.

Moreover, the temperature detector may include a thermistor. The thermistor includes a first terminal and a second terminal. The overheat determiner may include a voltage controlled transistor. Voltage between the first terminal and the second terminal may be applied to the voltage controlled transistor as control voltage.

Due to this structure, whether the power cord is in the overheated state can be determined based on whether the voltage controlled transistor is in the ON-state or the OFF-state.

A method for supplying electric power to an electric working machine according to another aspect of the present disclosure includes coupling a power cord from a power supply device to the electric working machine, detecting temperature of the power cord so as to output a detection signal indicating the temperature detected, determining that the power cord is overheated based on the detection signal, and limiting electric power from the power supply device to the electric working machine in accordance with determination that the power cord is overheated. This method can achieve the same effect as that achieved by the above-described power supply adapter.

BRIEF DESCRIPTION OF THE DRAWINGS

An example embodiment of the present disclosure will be described hereinafter with reference to the accompanying drawings, in which.

DETAILED DESCRIPTION OF THE PREFERRED EMBODIMENTS

Figure 1:
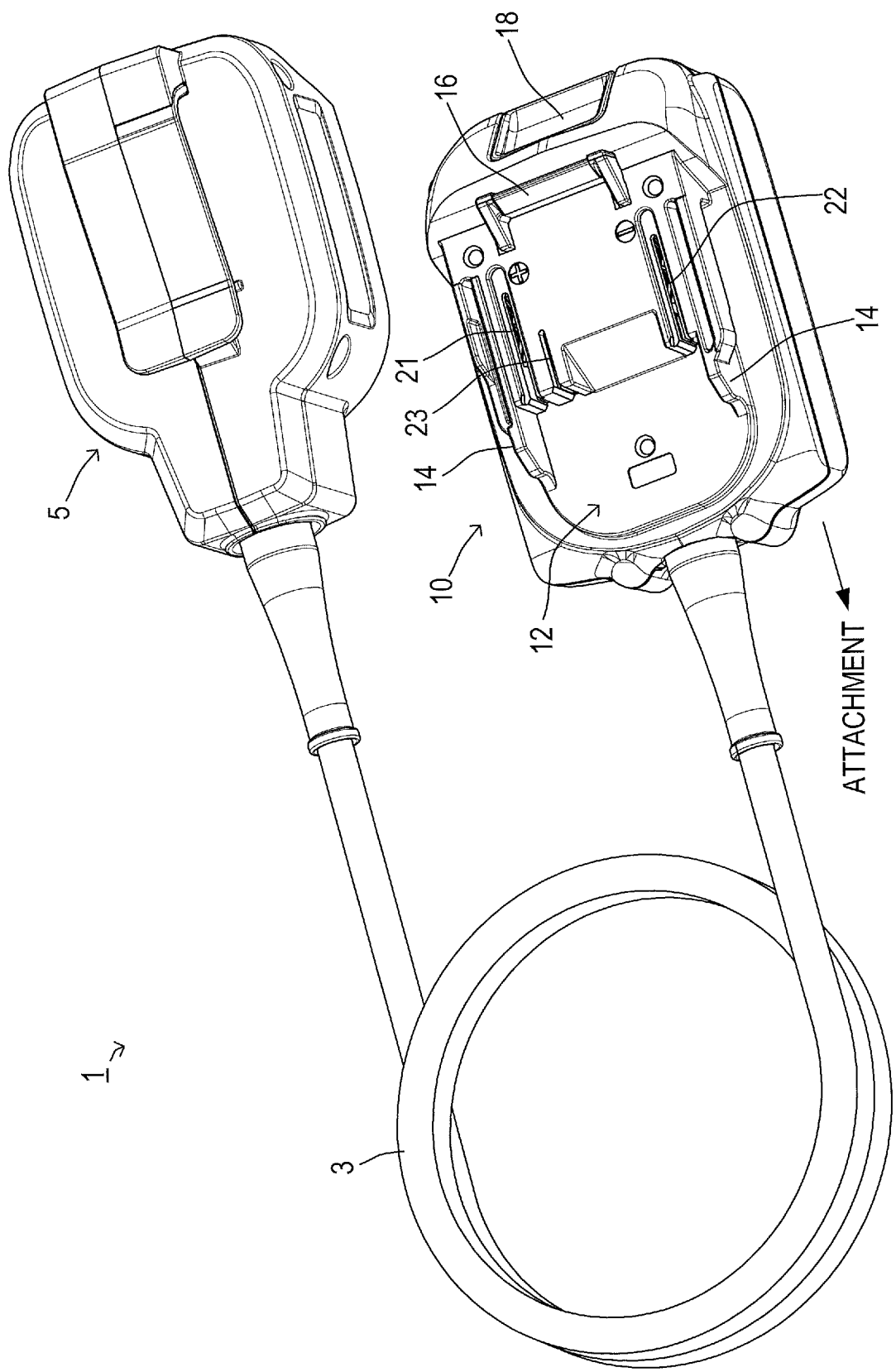
FIG. 1 is a perspective view showing an entire structure of a power supply adapter according to an embodiment of the present disclosure.

A power supply adapter 1 according to the present embodiment is a power transmitter configured to supply electric power to various types of electric working machines, such as an electric power tool and an electric grass cutter, from a battery pack that is a power supply device for such an electric working machine. As shown in FIG. 1, the power supply adapter 1 includes a power cord 3 for power transmission.

Provided at a first end of the power cord 3 is a power-source attachment portion 5 configured to be attachable to and detachable from the battery pack that serves as a power supply device. Provided at a second end of the power cord 3 is a working-machine attachment portion 10 configured to be attachable to and detachable from an attachment portion of an electric working machine 60 (see FIG. 4).

In the working-machine attachment portion 10, a pair of rails 14 is provided on an attachment surface 12 to be in contact with the electric working machine 60. The pair of rails 14 can be engaged with a pair of rails provided in an attachment portion of the electric working machine 60. In the vicinity of the rear ends of the pair of rails 14, a projection 16 for an engagement is provided. The projection 16 abuts on an engaging portion provided in the attachment portion of the electric working machine 60, determines the position of the working-machine attachment portion 10 relative to the electric working machine 60, and secures the working-machine attachment portion 10.

The working-machine attachment portion 10 can be attached to the electric working machine 60 by abutting a portion of the attachment surface 12 located opposite side of the rails 14 from the projection 16 on the attachment portion of the electric working machine 60, engaging the tips of the rails 14 with the rails of the attachment portion of the electric working machine 60, and sliding the working-machine attachment portion 10 in the direction of the arrow shown in FIG. 1.

The projection 16 projects from the attachment surface 12 of the working-machine attachment portion 10 due to the biasing force of a spring. When a user presses down an operating portion 18, the projection 16 is moved into the working-machine attachment portion 10.

When a user presses the operating portion 18 while the working-machine attachment portion 10 is attached to the attachment portion of the electric working machine 60, the projection 16 and an engagement hole provided to the attachment portion of the electric working machine 60 are disengaged. In this disengaged state, the working-machine attachment portion 10 can be easily removed from the electric working machine 60 by sliding the working-machine attachment portion 10 in a direction opposite to the direction for attachment.

Figure 4:
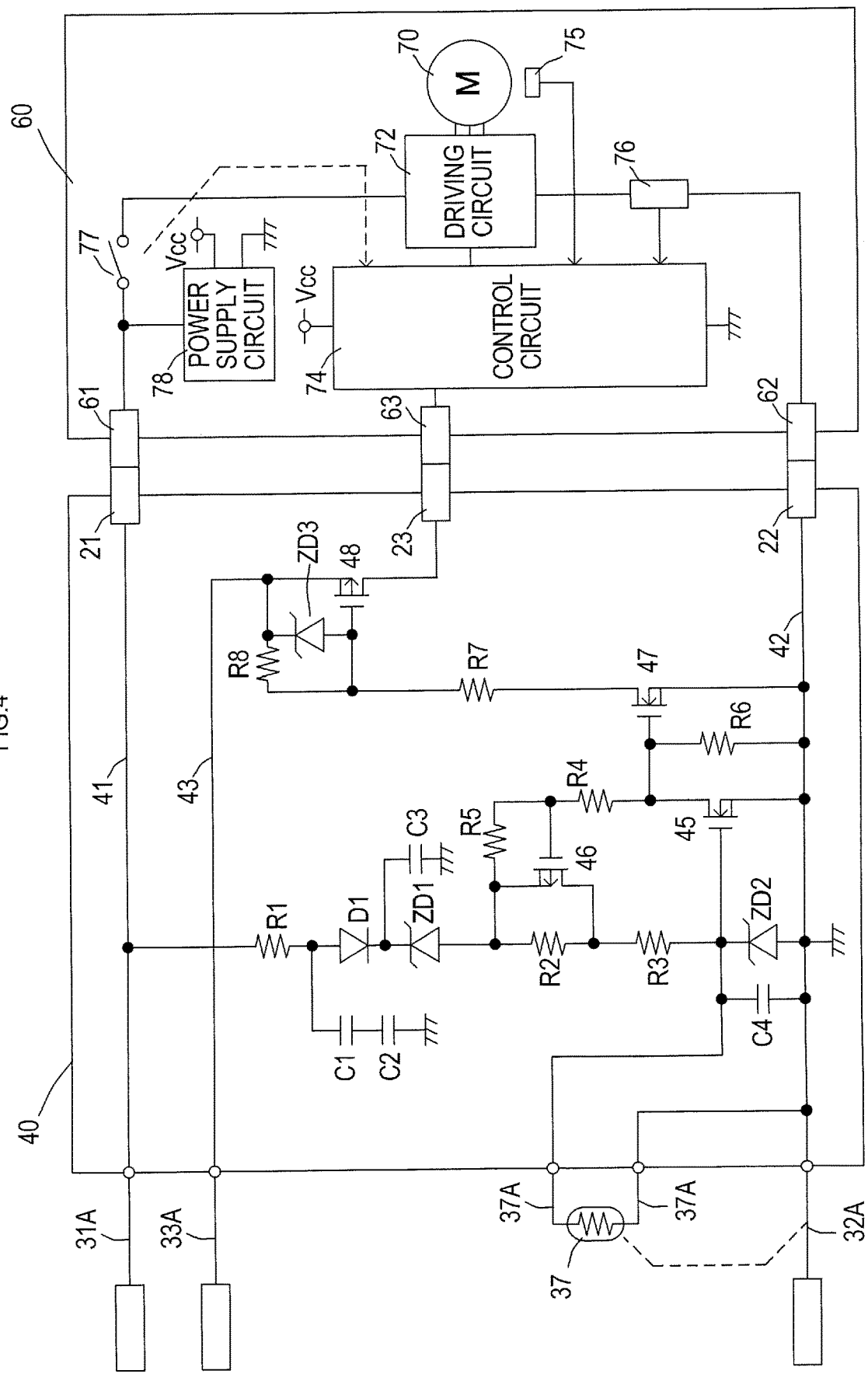
FIG. 4 is a circuit diagram showing a circuit configuration of an electric circuit for overheat determination incorporated in the substrate shown in FIGS. 3A to 3C and also showing a circuit configuration of an electric working machine coupled to the electric circuit.

In the working-machine attachment portion 10, power supply terminal portions 21, 22 and a communication terminal portion 23 are provided between the pair of rails 14. When the working-machine attachment portion 10 is attached to the attachment portion of the electric working machine 60, the power supply terminal portions 21, 22 and the communication terminal portion 23 are, as shown in FIG. 4, respectively coupled to a positive power supply terminal 61, a negative power supply terminal 62, and a communication terminal 63 provided in the attachment portion of the electric working machine 60.

On the other hand, the battery pack that the power-source attachment portion 5 is attached to is provided with an attachment surface configured in a substantially similar manner to the attachment surface 12 of the working-machine attachment portion 10. In other words, the battery pack can be directly attached to the electric working machine 60 without the power supply adapter 1 interposing therebetween.

The power-source attachment portion 5 is thus provided with a pair of rails to be engaged with rails of the battery pack when the power-source attachment portion 5 is attached to the attachment surface of the battery pack. The power-source attachment portion 5 is also provided with a positive power supply terminal, a negative power supply terminal, and a communication terminal to be respectively coupled to a positive power supply terminal and a negative power supply terminal, and a communication terminal of the battery pack.

Figure 2:
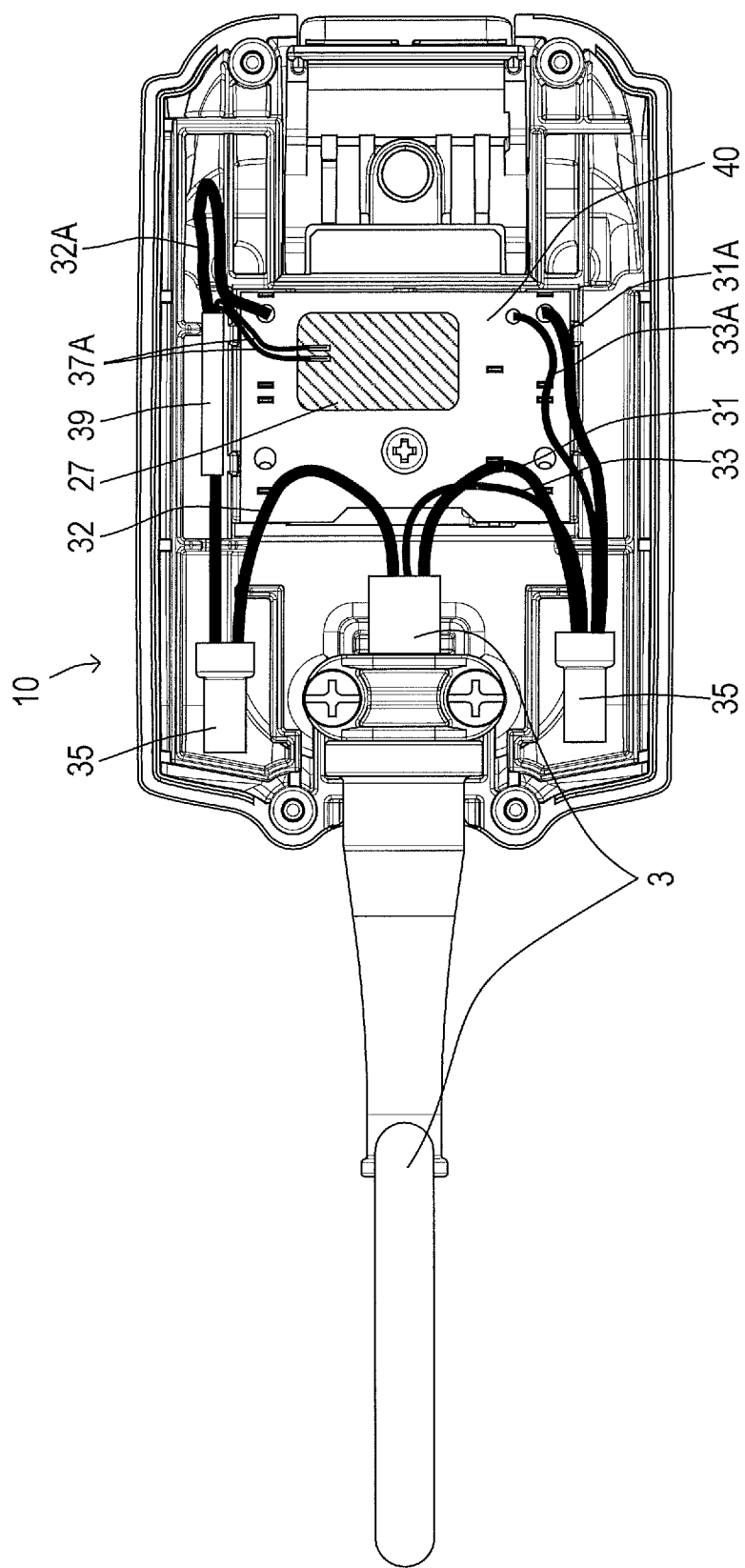
FIG. 2 is an explanatory diagram showing an internal structure of a working-machine attachment portion to be attached to an electric working machine.

As shown in FIG. 2, the power cord 3 is formed with a positive power supply line 31, a negative power supply line 32, and a communication line 33 covered by a protection tube. The positive power supply line 31 and the negative power supply line 32 respectively couple the positive power supply terminal and the negative power supply terminal of the power-source attachment portion 5 to the positive power supply terminal portion 21 and the negative power supply terminal portion 22 of the working-machine attachment portion 10. The communication line 33 couples a communication terminal of the power-source attachment portion 5 and the communication terminal portion 23 of the working-machine attachment portion 10.

Figure 3:
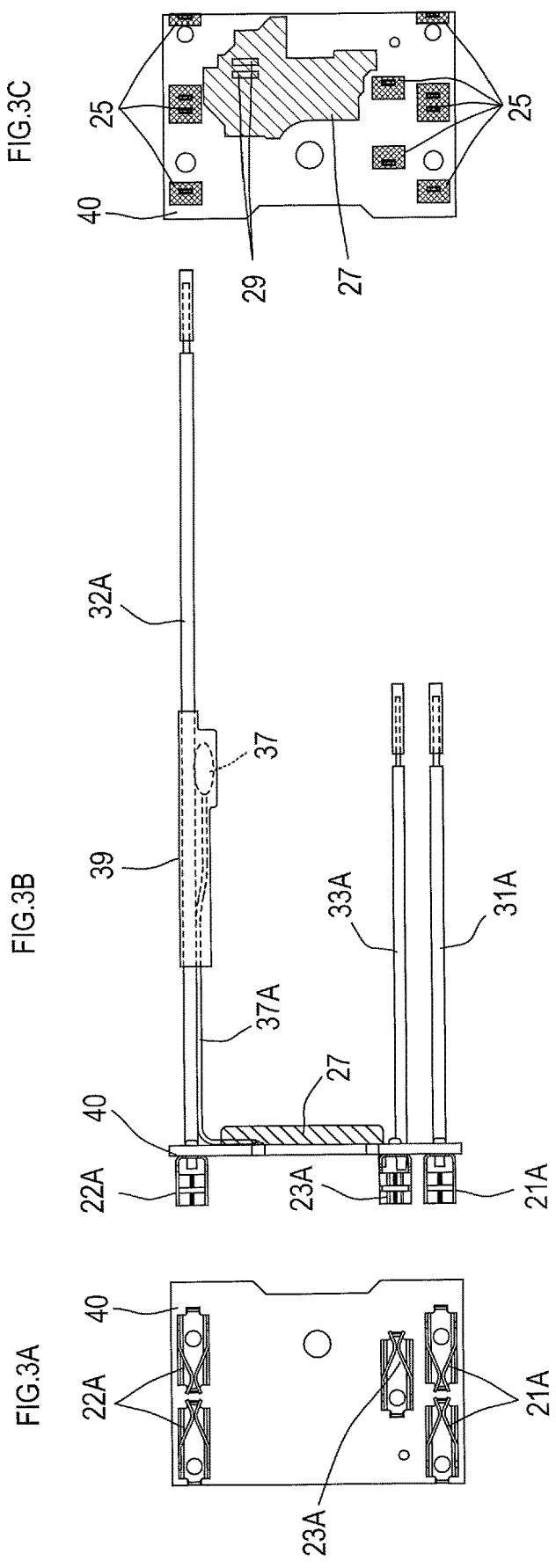
FIG. 3A is a plan view showing a substrate, housed in the working-machine attachment portion, and components coupled to the substrate, the substrate being viewed from a surface on which terminals are mounted.
FIG. 3B is an explanatory diagram showing the substrate and the components viewed from the right side in FIG. 3A.
FIG. 3C is an explanatory diagram showing the substrate viewed from the rear side in FIG. 3A, which is from the opposite side of the view in FIG. 3A.

As shown in FIGS. 2 and 3, the working-machine attachment portion 10 houses a circuit board 40 configured to couple the positive power supply line 31, the negative power supply line 32, and the communication line 33 of the power cord 3 respectively to the power supply terminal portions 21, 22 and the communication terminal portion 23.

As shown in FIG. 3A, mounted on the surface of the circuit board 40 located toward the attachment surface 12 (hereinafter referred to as the front surface) are power supply terminals 21A, 22A respectively included in the power supply terminal portions 21, 22 and a communication terminal portion 23A included in the communication terminal portion 23.

As shown in FIG. 3C, provided on a surface of the circuit board 40 opposite to the attachment surface 12 (hereinafter referred to as the back surface) are lands 25 to which the terminals 21A, 22A, 23A are respectively soldered.

On the circuit board 40 shown in FIG. 4, an electric circuit (hereinafter referred to as a determination circuit) configured to determine an overheated state of the power cord 3 is mounted. Various types of electronic components of the determination circuit are also mounted on the circuit board 40. As shown in FIG. 3C, an insulating adhesive 27 is applied on the portion of the circuit board 40 where these components are mounted. The determination circuit mounted on the circuit board 40 thus is protected by the adhesive 27.

As shown in FIGS. 2 and 3B, on the back surface of the circuit board 40, a connection cord coupled to the power cord 3 is soldered. This connection cord includes power supply lines 31A, 32A and a communication line 33A respectively coupled to the positive power supply line 31, the negative power supply line 32, and the communication line 33 that are included in the power cord 3.

The power supply lines 31A, 32A and the communication line 33A are made of the same type of wire rods as those of the power supply lines 31, 32 and the communication line 33 of the power cord 3 and respectively coupled to the power supply lines 31, 32 and the communication line 33 of the power cord 3 via crimp terminals 35.

The reason for the power supply lines 31A, 32A being made of the same type of wire rods as those of the power supply lines 31, 32 of the power cord 3 is that electric current as large as the electric current flowing in the power cord 3 flows in the power supply lines 31A, 32A and thus heat is similarly generated therein. The communication line 33A does not have to be the same type of wire rod as that of the communication line 33 of the power cord 3.

The connection cord including the power supply lines 31A, 32A and the communication line 33A is provided for easy replacement of the power cord 3. In other words, the power cord 3 can be replaced by cutting the crimp terminals 35 and connecting a new power cord 3 to the connection cord. This does not require any soldering to the circuit board 40 and thus allows easy replacement of the power cord 3.

Among the lines of the connection cord drawn from the circuit board 40, the negative power supply line 32A is longer than the positive power supply line 31A and the communication line 33A. Along the middle of the power supply line 32A, a thermistor 37 that serves as a temperature detector is disposed. The thermistor 37 is covered together with the power supply line 32A by a heat-shrink tube 39 and secured to the power supply line 32A due to the shrinking of the heat-shrink tube 39. The thermistor 37 has positive temperature characteristics in which the resistance increases with increasing temperature of the power supply line 32A (consequently, temperature of the power cord 3).

Two signal lines 37A of the thermistor 37 are drawn from the heat-shrink tube 39 toward the circuit board 40 and soldered on lands 29 provided on the back surface of the circuit board 40. This soldered portion and the signal lines 37A are protected by the adhesive 27.

The signal lines 37A of the thermistor 37 are thin and can be easily cut. Thus, in the present embodiment, the signal lines 37A are directly soldered to the circuit board 40, and the soldered portion is secured with the adhesive 27 so as to inhibit the signal lines 37A from being cut due to, for example, vibration.

The following describes the determination circuit mounted on the circuit board 40.

As shown in FIG. 4, the circuit board 40 includes a positive power supply path 41, a negative power supply path 42, and a communication path 43. The positive power supply path 41, the negative power supply path 42, and the communication path 43 respectively couple the positive power supply line 31A, the negative power supply line 32A, and the communication line 33A to the positive power supply terminal 21, the negative power supply terminal 22, and the communication terminal portion 23 that are coupled to the electric working machine 60.

Between the positive power supply path 41 and the negative power supply path 42, a resistor R1, a diode D1, a zener diode ZD1, resistors R2, R3 and a zener diode ZD2 are sequentially disposed in series from the side of the positive power supply path 41.

An anode of the diode D1 is coupled to the positive power supply path 41 via the resistor R1. This inhibits reverse flow of electric current from the side of the negative power supply path 42 toward the positive power supply path 41.

The connection point between the resistor R1 and the diode D1 is coupled to a ground line via surge absorbing capacitors C1, C2.

The zener diode ZD1 inhibits over-discharge from the battery pack, when the power supply voltage (that is, battery voltage) supplied via the diode D1 is at specified threshold voltage or smaller, by interrupting the current conduction path extending from the positive power supply path 41 to the negative power supply path 42.

At the connection point of the diode D1 and the zener diode ZD1, a capacitor C3 is coupled. The capacitor C3 is charged by direct current power (power supply voltage) supplied from the diode D1 and stores electric charge.

For example, when the power supply voltage temporarily decreases in response to the initiation of the operation of the electric working machine 60, the current conduction path is interrupted by the zener diode ZD1. The capacitor C3 discharges the electric charge that is stored while the power supply voltage decreases so as to inhibit failure of the determination circuit to determine the overheated state.

Due to this configuration, in a case where, for example, the power supply voltage temporarily decreases and instantaneous disconnection takes place, because of the discharge from the capacitor C3, the determination circuit allows an overheat determiner, which will be described below, to continue its operation. This can inhibit the overheat determiner from stopping its operation.

The zener diode ZD2 inhibits the voltages applied to the thermistor 37 and applied across the gate-source of an FET 45 (to be described later) from being equal to or larger than the specified breakdown voltage, and thus inhibits breakage of the thermistor 37 and the FET 45. To the zener diode ZD2, the thermistor 37 is coupled in parallel through the signal lines 37A.

To the zener diode ZD2, a voltage stabilizing capacitor C4 is also coupled in parallel. The negative power supply path 42 to which the zener diode ZD2 is connected is coupled to the ground line of the circuit board.

One side of the zener diode ZD2 toward a resistor R3 is coupled to the gate of the FET 45. The FET 45 serves as the aforementioned overheat determiner. The FET 45 is an n-channel field effect transistor, which is one of voltage controlled transistors in which the source is coupled to the negative power supply path 42.

Due to this configuration, when the temperature of the power cord 3 increases and the voltage between the both ends of the thermistor 37 exceeds the threshold voltage of the FET 45, the FET 45 is switched ON. The FET 45 is configured, by suitably setting the constant of the circuit element including the thermistor 37, to determine that the power cord 3 is in the overheated state when the temperature of the power cord 3 increases to a specified temperature and to be switched ON. Hereinafter, determination of the overheated state of the power cord 3 is referred to as overheat determination.

The drain of the FET 45 is coupled to the connection point of the zener diode ZD1 and a resistor R2 via resistors R4, R5. To this connection point, the source of an FET 46 that is a p-channel field effect transistor is coupled. To the connection point of the resistor R4 and the resistor R5, the gate of the FET 46 is coupled. The drain of the FET 46 is coupled to the connection point of the resistor R2 and the resistor R3.

Due to this configuration, when the FET 45 serving as the overheat determiner is switched ON, the gate potential of the FET 46 decreases. Then the FET 46 is switched ON and the resistor R2 becomes short-circuited at both ends. Consequently, the voltage applied to the thermistor 37 increases, that is, the gate voltage of the FET 45 increases, and the ON-state of the FET 45 is maintained even when the resistance of the thermistor 37 decreases with decreasing temperature of the power cord 3. As a result, the FET 45 keeps outputting the result of the overheat determination indicating that the power cord 3 is in the overheated state.

The ON-state of the FET 45 is maintained until, for example, when the power-source attachment portion 5 is removed from the battery pack and the power supply voltage between the positive power supply path 41 and the negative power supply path 42 decreases. When the power supply voltage decreases, the FETs 46, 45 are switched OFF and the determination circuit goes back to a regular temperature-monitoring state.

To the drain of the FET 45, the gate of an FET 47 that is an n-channel field effect transistor is coupled. Between the gate and the source of the FET 47, a resistor R6 is coupled. The source of the FET 47 is coupled to the negative power supply path 42.

Due to this configuration, when the FET 45 is switched OFF, the FET 47 is switched ON, and when the FET 45 is switched ON (that is, when overheat determination is made), the FET 47 is switched OFF.

The drain of the FET 47 is coupled to the gate of an FET 48, which is a p-channel field effect transistor, via a resistor R7. The FET 48 is disposed in the communication path 43 and has its drain coupled to the communication terminal portion 23 and its source is coupled to the communication line 33A.

Between the source and the gate of the FET 48, a resistor R8 and a zener diode ZD3 are coupled. The zener diode ZD3 limits the voltage applied between the source-gate of the FET 48 to its breakdown voltage or smaller so as to protect the FET 48.

Thus, when the FET 45 determines the overheated state of the power cord 3 and the FET 47 is switched OFF, the electric potential of the gate and that of the source of the FET 48 become the same and thus the FET 48 is switched OFF, which, as a result, interrupts the communication path 43. The communication terminal portion 23 consequently floats, and the overheated state of the power cord 3 is notified to the electric working machine 60.

As shown in FIG. 4, the electric working machine 60 includes, for example, a motor 70 that is the power source, a driving circuit 72 configured to drive the motor 70, a control circuit 74 configured to control driving of the motor 70 via the driving circuit 72, and a power supply circuit 78. The power supply circuit 78 is configured to generate direct current (DC) constant voltage Vcc with the electric power supplied from the battery pack so as to drive the control circuit 74. The control circuit 74 includes a microcomputer configured to be operated upon receiving the generated DC constant voltage Vcc.

The control circuit 74 controls driving of the motor 70 based on detection signals from a rotation detector 75, a current detector 76, and a trigger switch 77. The rotation detector 75 detects the rotating state of the motor 70. The current detector 76 detects a current flowing in the motor 70. The trigger switch 77 is operated by a user.

When driving the motor 70, the control circuit 74 determines whether the battery is capable of discharging the electric power based on whether a discharge permission signal outputted from the battery pack has been input. If it is determined that a discharge permission signal has been input via the communication terminal 63, the control circuit 74 determines that the battery is capable of discharging the electric power and drives the motor 70 in accordance with a command from the trigger switch 77.

If no discharge permission signal is input due to the communication terminal 63 being floating, the control circuit 74 determines that the battery is not capable of discharging and stops (disables) driving of the motor 70.

Thus, when the FET 45 that serves as the overheat determiner makes the overheat determination, the power supply adapter 1 according to the present embodiment notifies the electric working machine 60 of the overheated state so that the electric working machine 60 stops driving of the motor 70.

This can inhibit further increase in the temperature of the power cord 3, which in turn reduces unpleasant feelings given to the user due to the temperature increase and makes the power supply adapter 1 easier to handle.

The power supply adapter 1 according to the present embodiment is configured such that the FET 46 maintains the determination result during a period from when the FET 45 makes an overheat determination until when the power supply from the battery pack is interrupted and the power supply voltage decreases.

Thus, the power supply adapter 1 according to the present embodiment can inhibit the increase in the temperature of the power cord 3 that is associated with the electric working machine 60 resuming driving of the motor 70 when the temperature of the power cord 3 decreases in response to the overheat determination and the FET 48 is switched ON.

The thermistor 37 that serves as the temperature detector is coupled to the negative power supply line 32 included in the power cord 3 and is disposed along the power supply line 32A that is a similar type of power supply line as the negative power supply line 32. Thus, according to the power supply adapter 1 of the present embodiment, the temperature of the power cord 3 can be detected (estimated) with the thermistor 37 disposed along the power supply line 32A without providing a temperature detector along the power cord 3.

The thermistor 37 that serves as the temperature detector may be disposed along the power supply line 31A coupled to the positive power supply line 31 of the power cord 3 among the lines included in the connection cord. The temperature detector is only required to detect or estimate the temperature of the power cord 3, and thus may be directly provided to the power cord 3. Alternatively, the temperature detector may be configured with, for example, a thermistor having negative temperature characteristics that is different from the thermistor 37.

The above has described one embodiment of the present disclosure. However, the present disclosure is not limited to the aforementioned embodiment but can be carried out in various ways.

For example, in the power supply adapter 1 according to the aforementioned embodiment, the FET 48 that completes and interrupts the current conduction path 43 is disposed in the communication path 43 arranged on the circuit board 40. Thus, when the FET 45 determines the overheated state of the power cord 3, the FET 48 is switched OFF and consequently the communication terminal portion 23 floats.

Figure 5:
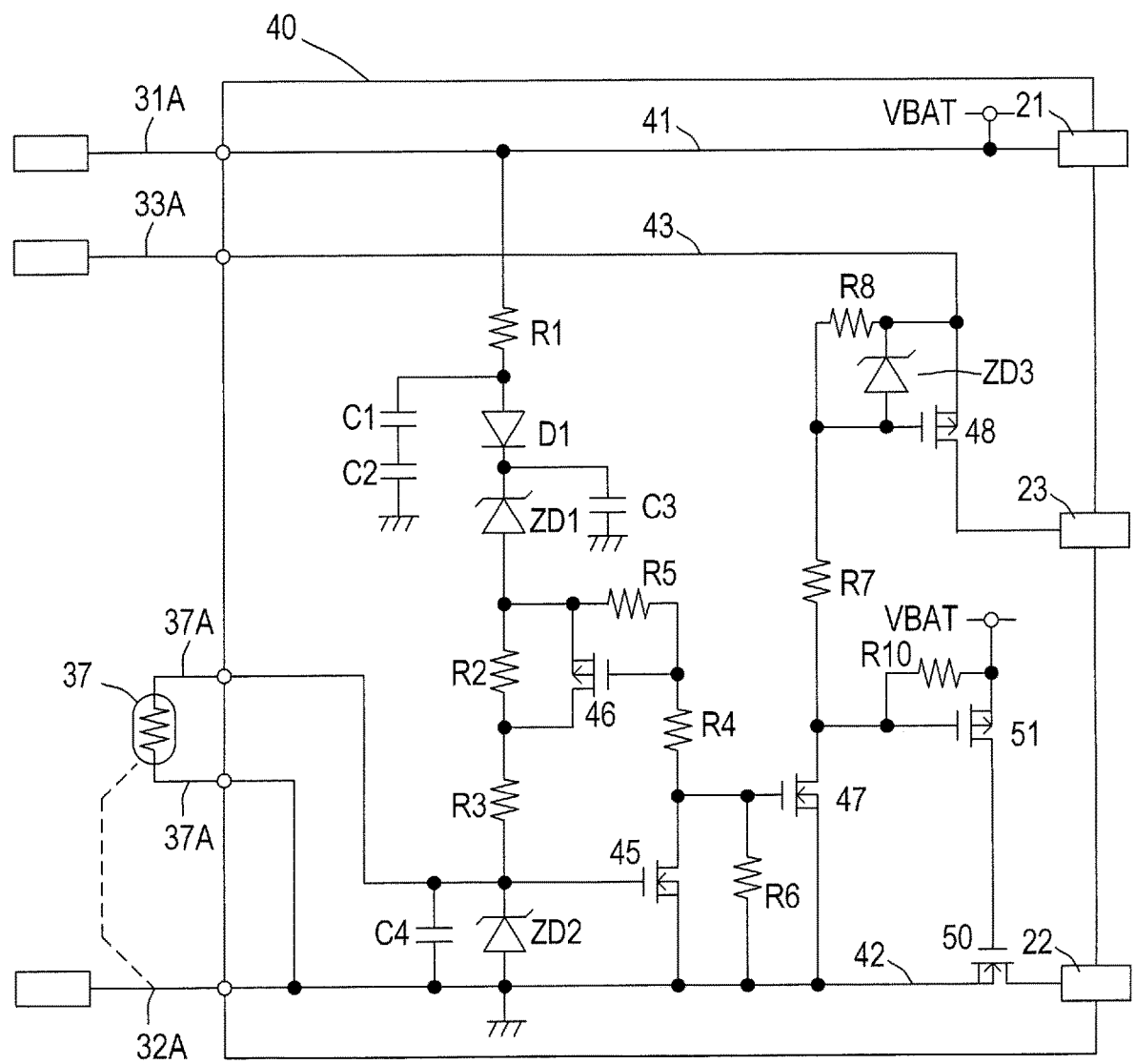
FIG. 5 is a circuit diagram showing a circuit configuration of an electric circuit for the overheat determination according to a first modified example.

Alternatively, the power supply adapter 1 shown in FIG. 5 according to a first modified example may include an FET 50 disposed in the connection portion of the power supply terminal portion 22 of the negative power supply path 42 and the power supply path 42 so as to complete and interrupt the power supply path 42. The power supply adapter 1 may be configured such that, when the FET 45 determines an overheated state, the FET 50 is switched OFF.

In FIG. 5, the FET 50 is an n-channel field effect transistor having its source coupled to the power supply path 42 extending toward the power supply line 32A and its drain coupled to the power supply terminal portion 22. The gate of the FET 50 is coupled to the positive power supply path 41 via an FET 51 that is a p-channel field effect transistor.

The FET 51 has its drain coupled to the gate of the FET 50, its source coupled to the positive power supply path 41, and its gate coupled to the drain of the FET 47. Between the gate and the source of the FET 51, a resistor R 10 is disposed.

Thus, when the FET 45 has not made the overheat determination and the FET 47 is in the ON-state, the FET 51 and the FET 50 are also in the ON-state. On the other hand, when the FET 45 makes the overheat determination and the FET 47 is switched OFF, the FET 51 and the FET 50 are switched OFF so as to interrupt the negative power supply path 42 is interrupted.

As a result, the power supply adapter 1 according to the first modified example can stop power supply from the battery pack to the electric working machine 60 and inhibit a temperature increase of the power cord 3.

As shown in FIG. 5, the power supply adapter 1 according to the first modified example is configured such that the FETs 48 and 50 are respectively disposed in the communication path 43 and the negative power supply path 42 so that the FETs 48 and 50 are switched OFF when the overheat determination is made. This configuration inhibits driving of the motor 70 of the electric working machine 60 even when one of the FETs 48 and 50 is short-circuited.

Figure 6:
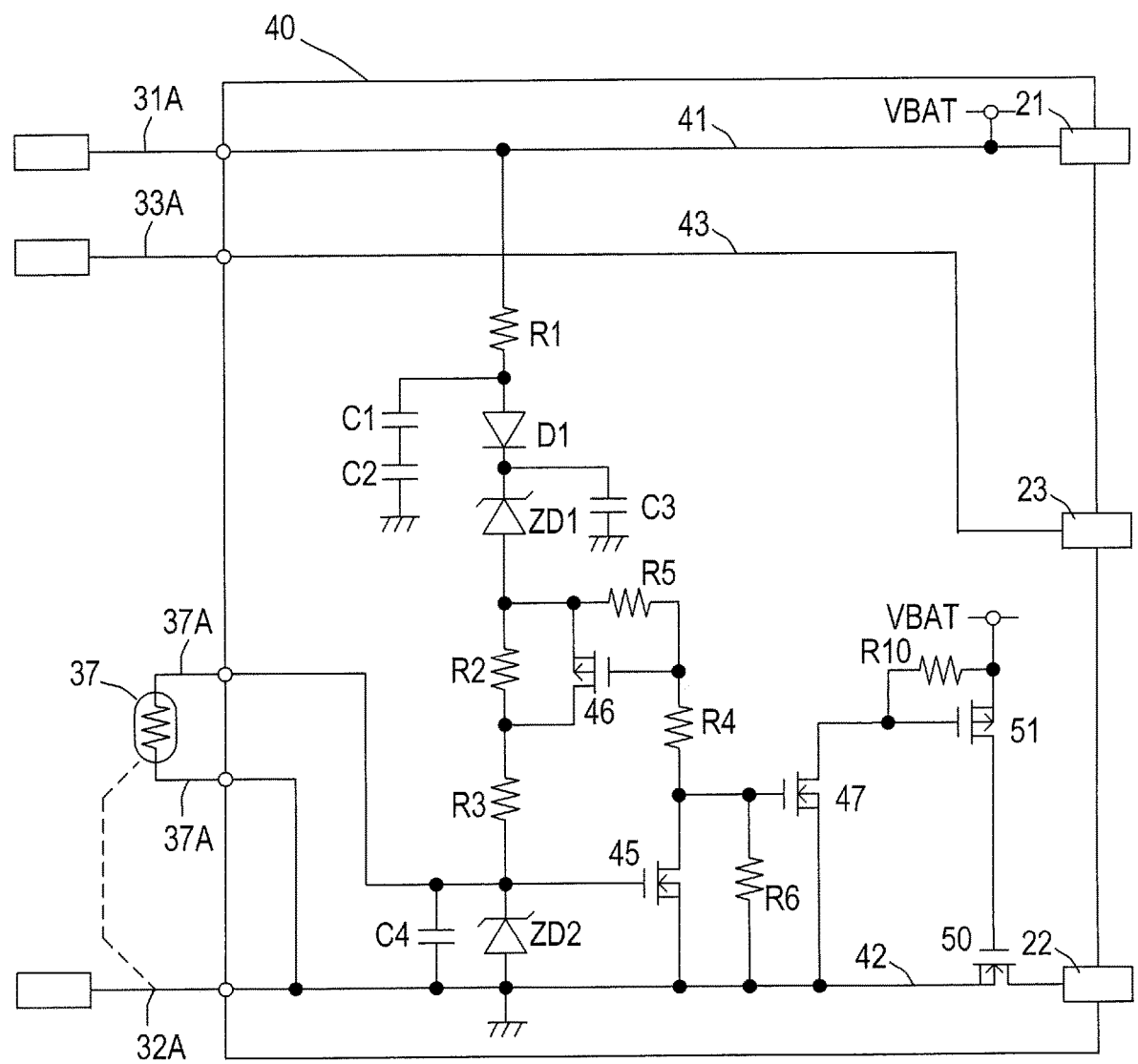
FIG. 6 is a circuit diagram showing a circuit configuration of an electric circuit for the overheat determination according to a second modified example.

As shown in FIG. 6, the power supply adapter 1 according to a second modified example includes the FET 50 disposed in the negative power supply path 42 and is configured such that, when the overheat determination of the power cord 3 is made, the FET 50 is switched OFF so as to interrupt the negative power supply path 42. In this case, the FET 48 may be omitted and the communication path 43 may be constantly completed.

In the aforementioned embodiment, the determination circuit is mounted on the circuit board of the working-machine attachment portion 10, and the overheat determination is made in the working-machine attachment portion 10. Alternatively, the determination circuit may be mounted on a circuit board disposed in the power-source attachment portion 5.

This configuration also allows the power supply adapter 1 to stop the operation (for example, driving of the motor 70) of the electric working machine 60 by making the overheat determination in the power-source attachment portion 5 so as to interrupt the power supply path from the battery pack to the electric working machine 60 and by notifying the electric working machine 60 of the overheated state of the power cord 3.

In the aforementioned embodiment, the battery pack serves as the power supply device and the power-source attachment portion 5 is attached to the battery pack so as to receive DC power from the battery pack. Alternatively, the power-source attachment portion 5 may be configured to receive electric power supply from an AC adapter having, for example, an AC/DC converter. In this case, the power-source attachment portion 5 may be attachable to either of the AC adapter and the battery pack.

Alternatively, the power-source attachment portion 5 may include an AC adapter and may be configured to receive power supply from an external AC power source (such as a commercial power source) and convert the AC power into DC power so as to output the converted DC power to the working-machine attachment portion 10 via the power cord 3. Furthermore, the working-machine attachment portion 10 may include an AC adapter and may be configured to receive power supply via an external AC power source, the power-source attachment portion 5, and the power cord 3 and to convert the AC power into DC power so as to output the converted DC power to the electric working machine.

Several functions possessed by a single component in the above-described embodiment may be achieved by several components. A single function possessed by a single component may be achieved by several components. Furthermore, several functions possessed by several components may be achieved by a single component, or a single function achieved by several components may be achieved by a single component. Some part of the structure of the above-described embodiment may be omitted. At least a part of the structure of the above-described embodiment may be added to or altered with the structure of other examples described above. Various aspects included in the technical ideas specified only by the languages recited in the claims correspond to the embodiments of the present disclosure.

What is claimed is:

1. A power supply adapter comprising:
    a power cord including a first end and a second end and configured to supply electric power from a power supply device to an electric working machine;
    a power-source attachment portion configured to attach to the power supply device and couple the first end of the power cord to the power supply device;
    a working-machine attachment portion configured to attach to the electric working machine and couple the second end of the power cord to the electric working machine, the working-machine attachment portion including a connection cord coupled to the power cord so as to form a portion of a power supply path from the power supply device to the electric working machine;
    a temperature detector disposed along the power cord or the connection cord and physically contacting the power cord or the connection cord, the temperature detector being configured to detect temperature of the power cord and to output a detection signal indicating the temperature detected; and
    an overheat determiner configured to determine that the power cord is in an overheated state based on the detection signal from the temperature detector and output an overheat determination result indicating that the power cord is in the overheated state.

2. The power supply adapter according to claim 1 further comprising:
    a notifying device configured to notify the electric working machine of the overheat determination result.

3. The power supply adapter according to claim 1 further comprising:
    an interrupting device configured to interrupt the power supply path in response to an output of the overheat determination result from the overheat determiner.

4. The power supply adapter according to claim 1, wherein the overheat determiner is configured to keep outputting the overheat determination result during a period from determination of the overheated state of the power cord until detachment of the power-source attachment portion from the power supply device.

5. The power supply adapter according to claim 1, wherein the overheat determiner is configured to be operated upon receipt of electric power supplied from the power supply device, further comprising:
    a capacitor disposed in a second power supply path from the power supply device to the overheat determiner, the capacitor being configured to be charged by the electric power supplied from the power supply device and to supply charging power to the overheat determiner.

6. The power supply adapter according to claim 1, wherein the temperature detector is disposed in the working-machine attachment portion and positioned in the power supply path so as to be away from a terminal coupled to the electric working machine.

7. The power supply adapter according to claim 2, wherein the notifying device is disposed in a communication path to be coupled to the electric working machine and configured to interrupt the communication path in response to an output of the overheat determination result from the overheat determiner so as to notify the electric working machine of the overheat determination result.

8. The power supply adapter according to claim 1, wherein the temperature detector is covered together with the connection cord by a shrunk tube and secured to the connection cord by the shrunk tube.

9. The power supply adapter according to claim 1,
wherein the temperature detector includes a thermistor, the thermistor including a first terminal and a second terminal,
the overheat determiner includes a voltage controlled transistor, and
voltage between the first terminal and the second terminal is applied to the voltage controlled transistor as control voltage.

10. A method for supplying electric power to an electric working machine, the method comprising:
coupling a power cord from a power supply device to the electric working machine;
detecting temperature of the power cord by a temperature detector so as to output a detection signal indicating the temperature detected, the temperature detector being disposed along the power cord or a connection cord and physically contacting the power cord or the connection cord, the connection cord being coupled to the power cord so as to form a portion of a power supply path from the power supply device to the electric working machine;
determining that the power cord is overheated based on the detection signal; and
limiting electric power from the power supply device to the electric working machine in accordance with determination that the power cord is overheated.

11. The power supply adapter according to claim 1, further comprising:
a circuit board to which the temperature detector and the overheat determiner are connected;
a positive power supply line and a negative power supply line of the power cord;
a positive connection cord of the connection cord, the positive connection cord connecting the positive power supply line and the circuit board; and
a negative connection cord of the connection cord, the negative connection cord connecting the negative power supply line and the circuit board,
wherein the temperature detector is disposed along the positive connection cord or the negative connection cord and physically contacts the positive connection cord or the negative connection cord.

12. The power supply adapter according to claim 1, wherein the connection cord is of a same type as the power cord.

13. The power supply adapter according to claim 9, further comprising:
a lock circuit configured to lock an output of the voltage controlled transistor,
wherein the voltage controlled transistor is configured such that the output of the voltage controlled transistor changes in response to a change of a state of the power cord into the overheated state, and
the lock circuit is configured to adjust the voltage between the first terminal and the second terminal so as to lock the output of the voltage controlled transistor in response to a change in the output of the voltage controlled transistor.

* * * * *